United States Patent
Sasaki et al.

(10) Patent No.: US 8,861,136 B2
(45) Date of Patent: Oct. 14, 2014

(54) SPIN CONDUCTION ELEMENT AND MAGNETIC SENSOR AND MAGNETIC HEAD USING SPIN CONDUCTION

(71) Applicant: TDK Corporation, Tokyo (JP)

(72) Inventors: Tomoyuki Sasaki, Tokyo (JP); Tohru Oikawa, Tokyo (JP); Hayato Koike, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/799,229

(22) Filed: Mar. 13, 2013

(65) Prior Publication Data
US 2013/0258524 A1 Oct. 3, 2013

(30) Foreign Application Priority Data

Mar. 29, 2012 (JP) ................. 2012-077365

(51) Int. Cl.
| | | |
|---|---|---|
| *G11B 5/127* | (2006.01) | |
| *G01R 33/06* | (2006.01) | |
| *G11B 5/02* | (2006.01) | |
| *H01L 43/08* | (2006.01) | |
| *G01R 33/12* | (2006.01) | |
| *G11B 5/33* | (2006.01) | |
| *H01L 43/02* | (2006.01) | |
| *H01L 29/82* | (2006.01) | |

(52) U.S. Cl.
CPC .............. *H01L 43/02* (2013.01); *G01R 33/06* (2013.01); *G11B 5/02* (2013.01); *H01L 43/08* (2013.01); *G01R 33/1284* (2013.01); *G11B 5/332* (2013.01)

USPC ................ 360/125.3; 360/324.2; 257/422

(58) Field of Classification Search
USPC ............ 360/324.2, 125.3, 121; 257/421, 422; 365/158
See application file for complete search history.

(56) References Cited

U.S. PATENT DOCUMENTS

| | | | | |
|---|---|---|---|---|
| 8,085,513 | B2 * | 12/2011 | Sasaki .................. | 360/324.2 |
| 8,502,332 | B2 * | 8/2013 | Sasaki et al. ........... | 257/422 |
| 2007/0064342 | A1 * | 3/2007 | Nakamura et al. ........ | 360/119 |
| 2007/0064351 | A1 * | 3/2007 | Wang et al. ............ | 360/324.2 |
| 2007/0253116 | A1 | 11/2007 | Takahashi | |
| 2008/0055793 | A1 * | 3/2008 | Djayaprawira et al. .... | 360/324.2 |
| 2008/0165453 | A1 * | 7/2008 | Kaiser et al. ........... | 360/324.2 |
| 2009/0141409 | A1 * | 6/2009 | Santos et al. ........... | 360/324.2 |
| 2009/0174971 | A1 * | 7/2009 | Tsuchiya et al. ......... | 360/324.2 |
| 2010/0296202 | A1 * | 11/2010 | Boone et al. ............ | 360/313 |
| 2011/0063758 | A1 * | 3/2011 | Wang et al. ............ | 360/324.2 |
| 2011/0204886 | A1 * | 8/2011 | Sasaki et al. ........... | 324/244 |

FOREIGN PATENT DOCUMENTS

| | | |
|---|---|---|
| JP | A-2007-299467 | 11/2007 |
| JP | A-2011-176012 | 9/2011 |
| JP | A-2012-69218 | 4/2012 |

* cited by examiner

*Primary Examiner* — Brian Miller
(74) *Attorney, Agent, or Firm* — Oliff PLC

(57) ABSTRACT

A spin conduction element includes a main channel layer having a first electrode, a second electrode, a third electrode, a fourth electrode, a fifth electrode, and a sixth electrode, and extending in a first direction. Spins are injected into the main channel layer from a second ferromagnetic layer constituting the second electrode and a fourth ferromagnetic layer constituting the fourth electrode, and a spin current is detected as a voltage in a third ferromagnetic layer constituting the third electrode.

13 Claims, 5 Drawing Sheets

US 8,861,136 B2

SPIN CONDUCTION ELEMENT AND MAGNETIC SENSOR AND MAGNETIC HEAD USING SPIN CONDUCTION

BACKGROUND OF THE INVENTION

1. Field of the Invention

The present invention relates to a spin conduction element and a magnetic sensor and magnetic head which use spin conduction.

2. Description of the Related Art

There have been known various elements that detect external magnetic fields (for example, refer to Japanese Unexamined Patent Application Publication No. 2007-299467 below). Magnetic heads and magnetic sensors used in, for example, hard disk drives (HDD) and the like have been desired to detect magnetic fields from minute regions and have high output characteristics. Conventional tunnel magnetoresistance (TMR) devices have a spin-valve structure and have relatively high output characteristics. A method of making elements finer is employed for detecting magnetic fields from minute regions. However, making the elements finer increases element resistances. For example, a limit of improvement in characteristics begins to appear in areas with a recording density of 1 Tbit/inch or more, thereby requiring other structures and methods. A method proposed as a method for resolving this problem is to detect a magnetic field from a minute area with high sensitivity by detecting a component with spins rotated by an external magnetic field based on a spin-current conduction phenomenon referred to as the "Hanle effect" (for example, refer to Japanese Unexamined Patent Application Publication Nos. 2011-176012 and 2010-213913 below).

SUMMARY OF THE INVENTION

When a spin current proposed in the related-art documents is used, a background voltage can be made zero under optimum conditions, and thus a high signal ratio can be basically obtained. However, weak signals accompanying the spin currents cause the need for amplification of signals according to demand. In fact, it is difficult to make the background voltage zero, and thus a method of achieving a necessary signal ratio by obtaining a high output voltage is employed. Therefore, although it is important to obtain a high output voltage even in a device using a spin current, a method for obtaining higher output is required.

There are some methods for resolving the problem. A basic method is to increase an amount of spin current, and this method is performed by increasing the efficiency of injection/detection of spins or considering an amount of current and a structure. The present invention proposes a method for obtaining high output by increasing an amount of spin current in a detection electrode by means of a structure.

A spin conduction element proposed in the present invention is considered to have a structure as shown in FIG. 1. The structure shown in FIG. 1 is generally referred to as a "non-local structure II of a spin conduction element. A channel 7A in which spins are conducted is disposed, and a first ferromagnetic layer 11A, a second ferromagnetic layer 11B, a first reference electrode 19A, and a second reference electrode 19B are mounted on the channel 7A. In this structure, the magnetization direction G1 of the first ferromagnetic layer 11A and the magnetization direction G2 of the second ferromagnetic layer 11B are the same axial direction. When a current is applied between the first ferromagnetic layer 11A and the first reference electrode 19A in order to inject spins into the channel 7A, a potential formed by a spin current injected into the channel 7A can be detected by measuring a voltage between the second ferromagnetic layer 11B and the second reference electrode 19B. The magnetization directions G1 and G2 correspond to the Y-direction in Japanese Unexamined Patent Application Publication Nos. 2007-299467 and 2011-176012 and to the X-direction in Japanese Patent Application No. 2010-213913.

In Japanese Unexamined Patent Application Publication No. 2007-299467 and Japanese Patent Application No. 2010-213913, an external magnetic field is applied in the Y-axis direction. In Japanese Unexamined Patent Application Publication No. 2007-299467, a relative angle between the magnetization directions of the first ferromagnetic layer 11A and the second ferromagnetic layer 11B is detected as a voltage. In Japanese Patent Application No. 2010-213913, spins flowing between the first ferromagnetic layer 11A and the second ferromagnetic layer 11B are rotated by an external magnetic field so that a component rotated or attenuated depending on the strength of the external magnetic field is detected as the voltage. In Japanese Unexamined Patent Application Publication No. 2011-176012, an external magnetic field is applied in the Z-axis direction. The same component as in Japanese Patent Application No. 2010-213913 is detected as a voltage.

In the patent literatures described above, a general non-local measurement method uses a one-dimensional structure in which spins are injected from one of the sides and are detected on the other side. This is a simple structure and is a structure clearly exhibiting the effect of spin current.

Accordingly, it is an object of the present invention to provide a spin conduction element capable of improving output in a structure in which an external magnetic field can be detected, and a magnetic sensor and a magnetic head which use spin conduction.

As shown in FIG. 2, a spin conduction element according to an embodiment of the present invention includes a main channel layer 7A having a first region 71, a second region 72, a third region 73, a fourth region 74, and a fifth region 75 and extending in a first direction, a first electrode 20A mounted on the first region 71, a second electrode 20B mounted on the second region 72, a third electrode 20C mounted on the third region 73, a fourth electrode 20D mounted on the fourth region 74, and a fifth electrode 20E mounted on the fifth region 75. The second electrode 20B, the third electrode 20C, and the fourth electrode 20D are made of ferromagnetic materials. Further, a second ferromagnetic layer 12B, a third ferromagnetic layer 12C, and a fourth ferromagnetic layer 12D are disposed on the second region 72, the third region 73, and the fourth region 74, respectively. The magnetization directions G2, G3, and G4 of the second ferromagnetic layer 12B, the third ferromagnetic layer 12C, and the fourth ferromagnetic layer 120 are the same. Since the magnetization directions G2, G3, and G4 are the same, the magnetization direction can be easily controlled by applying an external magnetic field or imparting shape anisotropy, thereby causing the effect of extending the degree of freedom of the element and decreasing the cost.

As shown in FIG. 3, a channel layer 7B extending in a second direction different from the first direction is provided in the third region 73 to be disposed on the same plane as the main channel layer 7A extending in the first direction. Further, a sixth electrode 20F is mounted on a sixth region 76 in the second direction.

The first electrode 20A and the fifth electrode 20E are each composed of a nonmagnetic material. Alternatively, when the first electrode 20A and the fifth electrode 20E are each composed of a ferromagnetic material, the magnetization directions G1 and G5 of the first ferromagnetic layer 12A and the fifth ferromagnetic layer 12E mounted on the first region 71 and the fifth region 75, respectively, are the same, and the directions G1 and G5 are opposite to the directions G2, G3, and G4. This case is illustrated in FIG. 4.

In order to obtain output, a current is applied to the first electrode 20A from the second electrode 20B, and a current is applied to the fifth electrode 20E from the fourth electrode 20D to measure a voltage between the third electrode 20C and the sixth electrode 20F. In this case, spins can be injected into the channel layer from both the ferromagnetic layers 12B and 12D of the second electrode 20B and the fourth electrode 20D and detected in the ferromagnetic layer 12C of the third electrode 20O. In general, spins are injected from one electrode and detected with one electrode, while in the method of the present invention, spins are injected from two electrodes, thereby increasing low output, which is the problem of related art, by means of a structure.

A first projection channel layer is formed to project from the side surface of the third region 73 of the main channel layer 7A in a planar direction perpendicular to the thickness direction of the main channel layer 7A, and both sides of the first projection channel layer in the thickness direction and both sides of the first projection channel layer in the first direction are covered, and the end surface of the first projection channel layer in the projecting direction is exposed, thereby forming a magnetic sensor employing the entry of a magnetic flux into the channel layer from the exposed end surface.

The magnetization directions of the second, third, and fourth ferromagnetic layers 12B, 12C, and 12D are perpendicular to the direction in which the first projection channel layer projects. Therefore, spins injected from the second ferromagnetic layer 12B and the fourth ferromagnetic layer 12D are rotated by a magnetic flux entering in the projecting direction, and thus a change in output with the rotation can be observed in the third ferromagnetic layer 12C.

The magnetization directions of the second, third, and fourth ferromagnetic layer 12B, 12C, and 12D are preferably pinned by antiferromagnetic layers disposed on the second, third, and fourth ferromagnetic layers 12B, 12C, and 12D, respectively. In this case, since these ferromagnetic layers have higher coercive force than the magnetic flux entering from the exposed end surface, the magnetization directions of the second, third, and fourth ferromagnetic layers 12B, 12C, 12D are little fluctuated by a magnetic field in the projecting direction, thereby causing the effect of decreasing noise.

Further, a barrier is formed between the main channel layer 7A and at least one of the second, third, and fourth ferromagnetic layers 12B, 12C, and 12D. The barrier is preferably a tunnel barrier composed of an insulating film. As a result, spins can be efficiently injected into the channel layer. Alternatively, the barrier is preferably a Schottky barrier. In this case, spins can be injected into the channel layer at low resistance, leading to decreases in heat generation and noise.

A magnetic sensor including the above-described element is used as a reading portion, and a writing portion is separately provided to permit use as a magnetic head. A combination of the magnetic head with a magnetic recording medium can be also used as a magnetic recording and reproducing device.

A magnetic sensor according to an embodiment of the present invention includes a channel including a main channel layer and a first projection channel layer, the periphery of the first projection channel layer in the projecting direction being surrounded by a magnetic shield so that an end surface of the first projection channel layer is exposed. Therefore, an external magnetic field can be supplied to the channel selectively from the exposed end surface. The direction of spins conducted in the channel is rotated around the axis of the applied magnetic field, and the spins diffuse accompanied with the rotation (so-called Hanle effect).

On the other hand, when an external magnetic field is not applied to the channel, the direction of spins in the channel is not changed and the spins diffuse as they are. Therefore, when a voltage output or resistance output with respect to the external magnetic field is read in the first ferromagnetic layer 12A or the second ferromagnetic layer 12B functioning as a reception electrode, a value corresponding to a degree of spin rotation produced depending on whether or not the external magnetic field is present can be detected. Therefore, a magnetic flux can be detected from a minute region corresponding to the exposed end surface of the channel.

As described above, in the magnetic sensor according to the embodiment of the present invention, the periphery of the first projection channel layer in the projecting direction is surrounded by the magnetic shield so that the end surface of the first projection channel layer is exposed. This structure can be easily formed, with high mass productivity, by previously forming a portion of the magnetic shield, forming the channel including the main channel layer and the first projection channel layer on the magnetic shield, and then forming the remaining portion of the magnetic shield on the side and upper surfaces of the first projection channel layer.

For example, when the magnetic sensor of the present invention is applied to a magnetic head, the magnetic sensor can be mounted perpendicularly to an ABS surface and thus preferably has high compatibility to a method for manufacturing a recording head unit formed by mounting perpendicularly to the ABS surface.

Further, the magnetic sensor according to the present invention does not require a process for forming a through hole for supplying a magnetic field in the magnetic shield, and thus the thickness of the end surface of the first projection channel layer can be made equal to the thickness of the main channel layer. Therefore, the thickness of a region where the external magnetic field applied from the end surface of the first projection channel layer enters can be made equal to the thickness of the main channel layer in which spins flow, thereby increasing output.

In addition, the magnetization directions of the second, third, and fourth ferromagnetic layers 12B, 12C, and 12D are preferably the same. In this case, magnetization of the second, third, and fourth ferromagnetic layers 12B, 12C, and 12D can be easily pinned.

The magnetization directions of the second, third, and fourth ferromagnetic layers 12B, 12C, and 12D are preferably the same as the direction in which the second, third, and fourth ferromagnetic layers 12B, 12C, and 12D are mounted on the main channel layer 7A. In this case, the magnetization direction of spins injected from the ferromagnetic layers and conducted in the channel is rotated by the external magnetic field applied from the end surface of the first projection channel layer. Consequently, the above-described detection of the magnetic flux can be preferably performed.

The magnetization directions of the second, third, and fourth ferromagnetic layers 12B, 12C, and 12D preferably coincide with the first direction. Also in this case, the magnetization direction of spins injected from the ferromagnetic layers and conducted in the channel is rotated by the external magnetic field applied from the end surface of the first projection channel layer. Consequently, the above-described detection of the magnetic flux can be preferably performed.

The end surface of the first projection channel layer in the projecting direction preferably has a rectangular shape, a triangular shape, a trapezoidal shape, or a circular shape. With any one of these shapes, the external magnetic field can be preferably detected.

In addition, the surfaces of the main channel layer and the first projection channel layer are covered with an insulating layer between the first ferromagnetic layer 12A and the fifth ferromagnetic layer 12E. This can prevents outflow of the spin current from the main channel layer and the first projection channel layer to the magnetic shield, thereby permitting precise measurement of output produced by the external magnetic field.

The third ferromagnetic layer 12C is disposed at a center of the distance between the second ferromagnetic layer 12B and the fourth ferromagnetic layer 12D. As a result, the influences of the spin currents conducted from the second ferromagnetic layer 12B and the fourth ferromagnetic layer 12D become equivalent, and thus maximum spin output can be obtained.

Also, a permanent magnet is preferably further provided for supplying a magnetic field to the main channel layer through the end surface of the first projection channel layer. When a magnetic field is not applied using the permanent magnet, an output peak appears at zero external magnetic field to be detected. However, the output peak position can be shifted by applying the magnetic field to the channel using the permanent magnet, and thus an output peak can be generated when the external magnetic field is not zero.

The material of the second, third, and fourth ferromagnetic layers 12B, 12C, and 12D is preferably a metal selected from the group consisting of Cr, Mn, Co, Fe, and Ni, an alloy containing at least one element of the group, or a compound containing at least one element selected from the group and at least one element selected from the group consisting of B, C, N, Si and Ge. Since these materials are ferromagnetic materials having high spin polarizability, the function as a spin injection electrode or spin reception electrode can be preferably realized.

The material of the first and fifth ferromagnetic layers 12A and 12E is preferably a metal selected from the group consisting of Cr, Mn, Co, Fe, and Ni, an alloy containing at least one element of the group, or a compound containing at least one element selected from the group and at least one element selected from the group consisting of B, N, Si, and Ge. Since these materials are ferromagnetic materials having high spin polarizability, the function as a spin injection electrode or spin reception electrode can be preferably realized.

The material of the channel layer 7A and the first projection channel layer is preferably a semiconductor containing any one of Si, Ge, GaAs, C, and ZnO. Since these semiconductors have a relatively long spin diffusion length, spins can be preferably accumulated in the channels.

A magnetic head according to an embodiment of the present invention includes a reading head unit including the magnetic sensor described above, and a recording head unit for writing. Therefore, a novel magnetic head using the so-called Hanle effect can be provided.

According to the present invention, it is possible to provide a magnetic sensor and a magnetic head suitable for mass production and capable of improving output with a structure in which a magnetic flux can be detected from a minute region.

DESCRIPTION OF THE PREFERRED EMBODIMENTS

Figure 1:
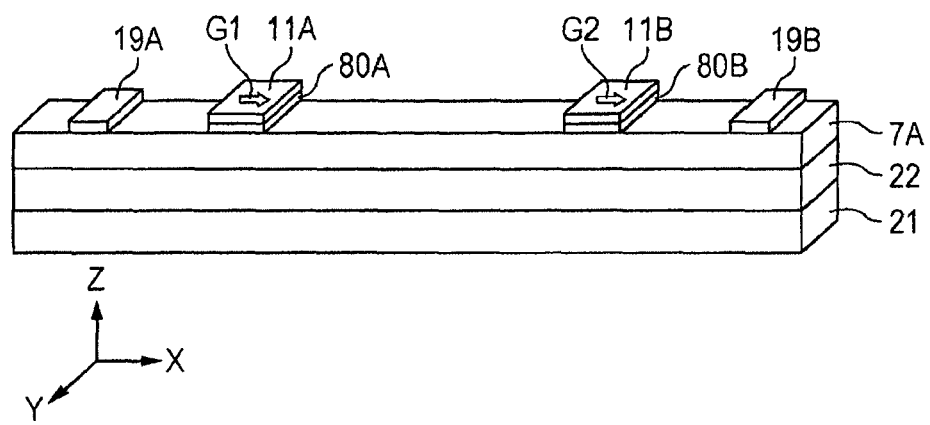
FIG. 1 is a schematic perspective view of general non-local measurement.

A spin conduction element according to a preferred embodiment of the present invention is described in detail below with reference to the drawings. Each of the drawings shows a XYZ-rectangular coordinate axis system. In description of the drawings, the same component is denoted by the same reference numeral to avoid duplicated description.

FIG. 1 is a schematic perspective view of a general spin conduction element. The spin conduction element mainly includes a substrate 21, a channel 7A, a ferromagnetic layer 11A, and a ferromagnetic layer 11B and is adapted to detect an external magnetic field B in the Y-axis direction. The substrate 21 is, for example, an AlTiC substrate.

Further, a reference electrode 19A is disposed outside the ferromagnetic layer 11A, and a reference electrode 19B is disposed outside the ferromagnetic layer 11B.

When a current is applied to the reference electrode 19A from the ferromagnetic layer 11A, the external magnetic field B can be detected by measuring a voltage between the ferromagnetic layer 11B and the reference electrode 19B.

Figure 2:
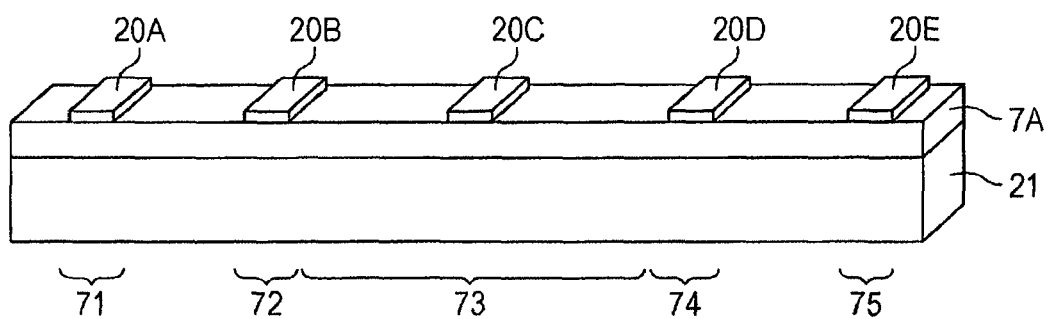
FIG. 2 is a schematic perspective view of the most basic portion of the present invention.

FIG. 2 is a schematic perspective view of a spin conduction element according to an embodiment of the present invention. A main channel layer 7A is formed on a substrate 21. The substrate 21 is, for example, an AlTiC substrate. In this embodiment, SiOx is formed to a thickness of 100 nm on the AlTiC substrate 21. The main channel layer 7A is composed of Si formed by a Czochralski (CZ) method, the Si formed by the CZ method being cut and bonded to the substrate 21. The spin conduction element includes the main channel layer 71 having a first region 71, a second region 72, a third region 73, a fourth region 74, and a fifth region 75 and extending in a first direction, a first electrode 20A mounted on the first region 71, a second electrode 20B mounted on the second region 72, a third electrode 20C mounted on the third region 73, a fourth electrode 20D mounted on the fourth region 74, and a fifth electrode 20E mounted on the fifth region 75. The second electrode 20B, the third electrode 20C, and the fourth electrode 20D are made of ferromagnetic materials. Thus, a second ferromagnetic layer 12B, a third ferromagnetic layer 12C, and a fourth ferromagnetic layer 12D are disposed on the second region 72, the third region 73, and the fourth region 74, respectively. The magnetization directions G2, G3, and G4 of the second ferromagnetic layer 12B, the third ferromagnetic layer 12C, and the fourth ferromagnetic layer 12D are the same.

Figure 3:
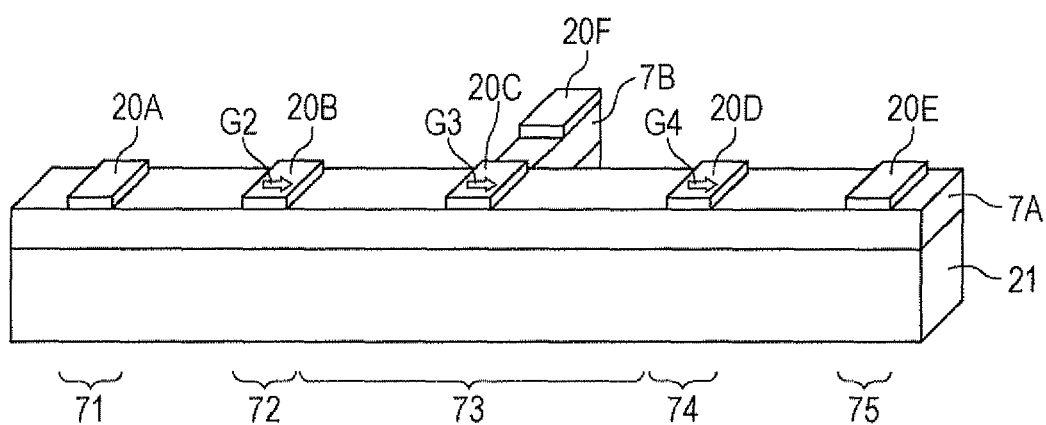
FIG. 3 is a drawing showing a reference electrode formed for detecting spins.

A channel 7 includes the main channel layer 7A extending in the X-axis direction (first direction) and a channel layer 7B extending in the Y-axis direction. As shown in FIG. 3, the channel layer 7B extends in the Y-axis direction within the third region 73.

In addition, ion for imparting conductivity may be added to the channel 7. The ion concentration can be, for example, $1.0 \times 10^{15}$ to $1.0 \times 10^{22}$ cm$^{-3}$, and the type of ion is phosphorus. The channel 7 is preferably composed of a material having a long spin lifetime and can be composed of a semiconductor containing, for example, any one of Si, Ge, GaAs, C, and ZnO.

In the channel 7, the distance between the second ferromagnetic layer 12B and the third ferromagnetic layer 12C and the distance between the third ferromagnetic layer 12C and the fourth ferromagnetic layer 12D are preferably equal to or smaller than the spin diffusion length of the material used for the channel 7.

The second ferromagnetic layer 12B and the fourth ferromagnetic layer 12D function as injection electrodes for injecting spins into the channel 7, and the third ferromagnetic layer 12C functions as a reception electrode for detecting spins conducted in the channel 7.

The second ferromagnetic layer 12B is mounted on the second region 72 of the channel 7. The third ferromagnetic layer 12C is mounted on the third region 73 of the channel 7. The fourth ferromagnetic layer 12D is mounted on the fourth region 74 of the channel 7.

Each of the second ferromagnetic layer 12B, the third ferromagnetic layer 12C, and the fourth ferromagnetic layer 12D has the shape of a rectangular parallelepiped having a long axis in the Y-axis direction.

The widths of the first ferromagnetic layer 12A and the second ferromagnetic layer 12B in the X-axis direction can be made the same.

Figure 4:
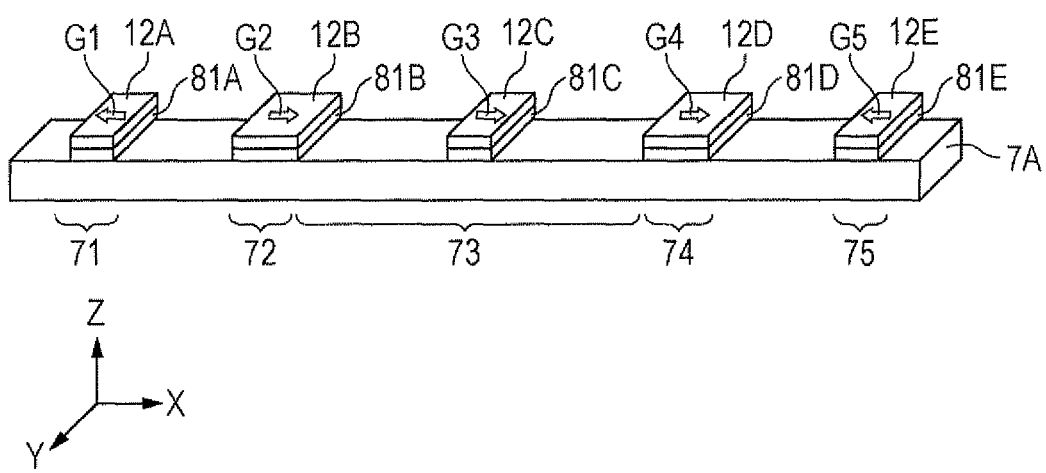
FIG. 4 is a schematic perspective view showing a first electrode, a second electrode, a third electrode, a fourth electrode, and a fifth electrode each of which is made of a ferromagnetic layer.

As shown in FIGS. 3 and 4, the magnetization directions G2, G3, and G4 of the second, third, and fourth ferromagnetic layers 12B, 12C, and 12D, respectively, can be made the same as, for example, the magnetization direction G2 of the second ferromagnetic layer 12B. In this case, magnetization of the second, third, and fourth ferromagnetic layers 12B, 12C, and 12D can be easily pinned. The second, third, and fourth ferromagnetic layers 12B, 12C, and 12D are each made of a ferromagnetic material. The material of each of the second, third, and fourth ferromagnetic layers 12B, 12C, and 12D is, for example, a metal selected from the group consisting of Cr, Mn, Co, Fe, and Ni, an alloy containing at least one element of the group, or a compound containing at least one element selected from the group and at least one element selected from the group consisting of B, C, N, Si, and Ge.

As shown in FIGS. 2, 3, and 4, the first electrode 20A and the fifth electrode 20E are further provided. The first electrode 20A is provided on the first region 71 of the channel layer 7A. The fifth electrode 20E is provided on the fifth region 75 of the channel 7. The first electrode 20A, the second ferromagnetic layer 12B serving as the second electrode 20B, the third ferromagnetic layer 12C serving as the third electrode 20C, the fourth ferromagnetic layer 12D serving as the fourth electrode 20D, and the fifth electrode 20E are disposed on the channel layer 7A in that order at predetermined intervals in the X-axis direction. Each of the first electrode 20A and the fifth electrode 20E is composed of, for example, a conductive material such as Al or the like.

In addition, a barrier is preferably further provided between the ferromagnetic layers and the channel layer. The barrier is provided between the main channel layer 7A and at least one of the second, third, and fourth ferromagnetic layers 12B, 12C, and 12D. This permits injection of more spin-polarized electrons into the main channel layer 7A from at least one of the second and fourth ferromagnetic layers 12B and 12D, thereby enhancing potential output of a magnetic sensor.

In the embodiment shown in the drawings, the barrier is a tunnel barrier composed of an insulating film 81. For example, as shown in FIG. 4, an insulating film 81B is provided between the second region 72 of the main channel layer 7A and the second ferromagnetic layer 12B. Although FIG. 4 shows a case where the insulating film 81B includes a single layer, the insulating film 81B may have a mounted structure including a plurality of layers. This applies to any one of the ferromagnetic layers. Examples of a material which can be used for the insulating film 81 include magnesium oxide, aluminum oxide, titanium oxide, spinel oxide, zinc oxide, and the like. The thickness of the insulating film 81 is preferably 3 nm or less in view of suppression of an increase in resistance and function as a tunnel insulating layer. The thickness of the insulating film 81 is preferably 0.4 nm or more in view of the thickness of a one atomic layer.

FIG. 4 is a schematic perspective view of a spin conduction element in which all the first, second, third, fourth, and fifth electrodes shown in FIG. 2 are composed of ferromagnetic materials. The first electrode 20A includes the first ferromagnetic layer 12A and an insulating film 81A. The fifth electrode 20E includes the fifth ferromagnetic layer 12E and an insulating film 81E.

As described above, the magnetization directions G2, G3, and G4 of the second, third, and fourth ferromagnetic layers 12B, 12C, and 12D, respectively, are the same. Further, preferably, the magnetization directions G1 and G5 of the first and fifth ferromagnetic layers 12A and 12E are the same, and the magnetization directions G1 and G5 are opposite to the magnetization directions G2, G3, and G4. In this case, when a current for injecting spins is passed between the first ferromagnetic layer 12A and the second ferromagnetic layer 12B, spins in the same direction are injected into the main channel layer 7A from both the first ferromagnetic layer 12A and the second ferromagnetic layer 12B. Similarly, when a current for injecting spins is passed between the fourth ferromagnetic layer 12D and the fifth ferromagnetic layer 12E, spins in the same direction are injected into the main channel layer 7A from both the fourth ferromagnetic layer 12D and the fifth ferromagnetic layer 12E.

Figure 5:
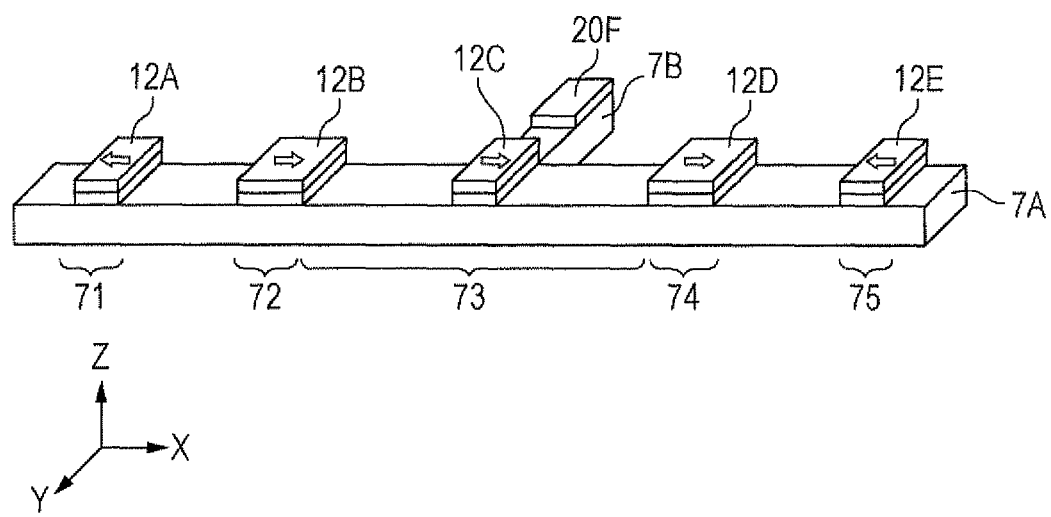
FIG. 5 is a schematic drawing showing a projection formed in a channel layer.

FIG. 5 is similar to FIG. 3 but is a schematic perspective view of a spin conduction element in which all first, second, third, fourth, and fifth electrodes are composed of ferromagnetic materials. In this case, spins injected from the first, second, fourth, and fifth ferromagnetic layers 12A, 12B, 12D, and 12E can be detected by measuring a voltage between the third ferromagnetic layer 12C and the sixth electrode 20F.

Figure 6:
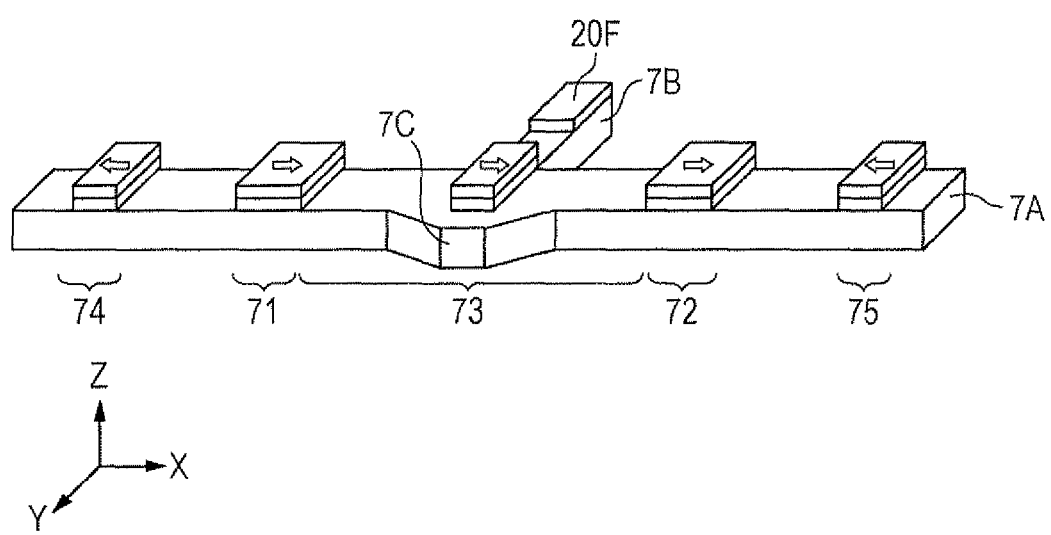
FIG. 6 is a schematic drawing showing a projection formed in a channel layer for a magnetic sensor.

FIG. 6 is a schematic perspective view of the case of application to a magnetic head and a magnetic sensor. A third channel layer 7C projects from the side surface of the third region 73 of the main channel layer 7A in a direction (Y-axis direction) perpendicular to the thickness direction (Z-axis direction) of the main channel layer 7A. More specifically, the third channel layer 7C projects in a direction (Y-axis direction) perpendicular to the first direction (X-axis direction) and perpendicular to the mounting direction (Z-axis direction) of the electrodes with respect to the channel 7.

Figure 7:
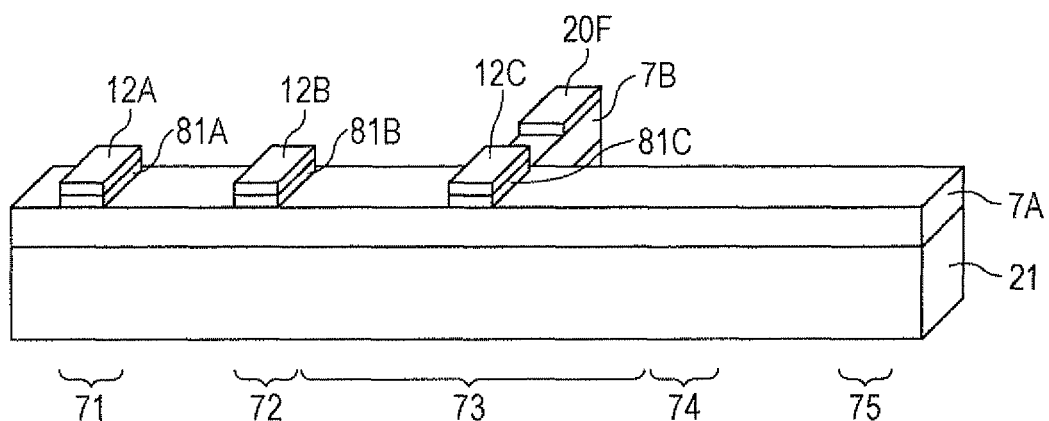
FIG. 7 is a schematic drawing of Comparative Example 1 of Example 1 in which a fourth ferromagnetic layer and a fifth ferromagnetic layer are not provided.

FIG. 7 shows a spin conduction element in which the fourth ferromagnetic layer 12D of the fourth electrode 20D and the fifth ferromagnetic layer 12E of the fifth electrode 20E shown in FIG. 5 are not provided. When a current is passed between the first ferromagnetic layer 12A and the second ferromagnetic layer 12B, spins are injected into the main channel layer 7A from the first ferromagnetic layer 12A and the second ferromagnetic layer 12B.

Figure 8:
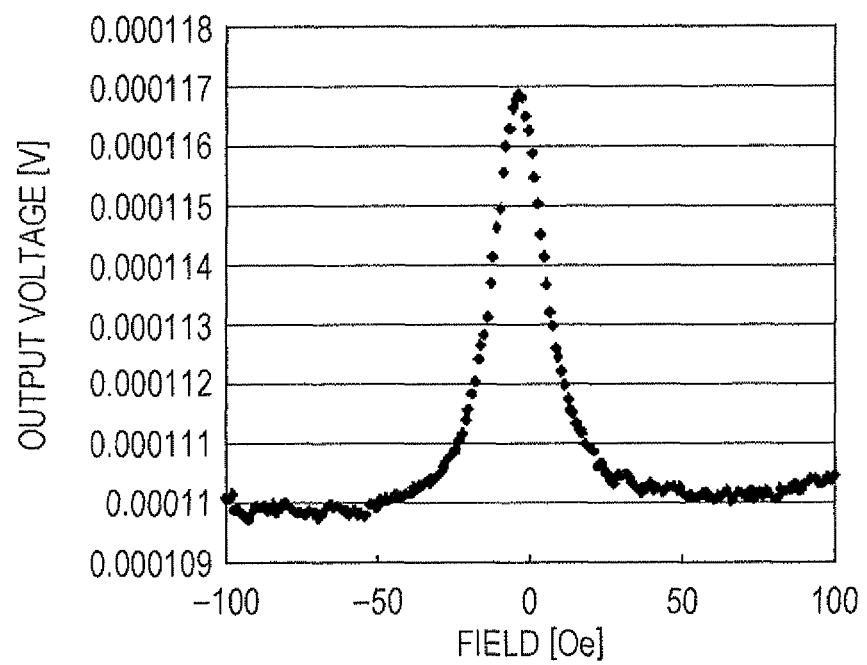
FIG. 8 is a graph showing the results of non-local Hanle measurement in the case shown in FIG. 5.

FIG. 8 shows the results of non-local Hanle measurement in the case shown in FIG. 5. However, a current is applied between the first ferromagnetic layer 12A and the second ferromagnetic layer 12B and between the fourth ferromagnetic layer 12D and the fifth ferromagnetic layer 12E, and a voltage is detected between the third ferromagnetic layer 12C and sixth electrode 20F.

Figure 9:
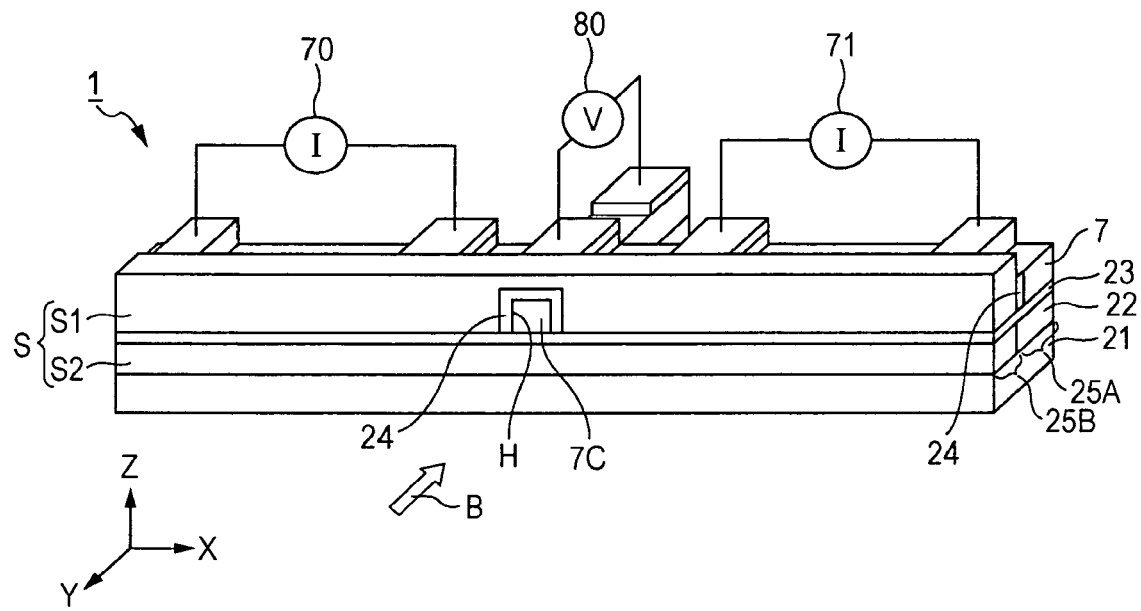
FIG. 9 is a schematic drawing showing a magnetic sensor.

FIG. 9 is a schematic perspective view showing a magnetic shield S provided on the spin conduction element shown in FIG. 6. The magnetic shield S is provided for shielding the channel 7 and the first, second, third, fourth, and fifth ferromagnetic layers 12A, 12B, 12C, 12D, and 12E from entry of an external magnetic field. The magnetic shield S covers, with an insulating layer, the both sides of the third channel layer 7C in the thickness direction (Z-axis direction) and both sides of the third channel layer 7C in the first direction (X-axis direction) and exposes the end surface of the third channel layer 7C in the projecting direction. The magnetic shield S includes a first magnetic shield layer S1 and a second magnetic shield layer S2. The first magnetic shield layer S1 is provided on the third channel layer 7C to be disposed above the substrate 21. The second magnetic shield S2 is provided on the substrate 21. Examples of a material of the magnetic shield S (the first magnetic shield layer S1 and the second magnetic shield layer S2) include soft magnetic materials such as alloys containing Ni and Fe, sendust, alloys containing Fe and Co, alloys containing Fe, Co, and Ni, and the like. The thickness (length in the Z-axis direction) of the first magnetic shield layer S1 is larger than the thicknesses (length in the Z-axis direction) of the main channel layer 7A and the third channel layer 7B and is, for example, 0.02 µm to 1 µm. Also, the thickness (length in the Z-axis direction) of the second magnetic shield layer S2 is, for example, 0.02 µm to 1 µm.

The magnetic shield S has a through hole H which allows the end surface of the third channel layer 7C in the projecting direction (Y-axis direction) to be exposed. The through hole H is formed to apply the external magnetic field B to the main channel layer 7A through the third channel layer 7C. The external magnetic field B enters the third channel layer 7C through the end surface exposed from the through hole H.

The end surface exposed from the through hole H is a flat surface and has a rectangular shape. The shape of the through hole H corresponds to the shape of the end surface and can take any one of various shapes as viewed from the axial direction (−Y-axis direction) of the through hole H. In this case, the through hole H has a rectangular shape. One of the sides of the through hole H has a length (length in the X-axis direction) D1 of, for example, 0.01 µm to 0.1 µm, and the other side has a length (length in the Z-axis direction) D2 of, for example 0.001 µm to 0.1 µm. The length (length in the Z-axis direction) D2 of the other side of the through hole H is the same as the thickness of the main channel layer 7A and the third channel layer 7C.

A magnetic sensor 1 further includes a lower insulating layer 22 and an intermediate insulating layer 23. The lower insulating layer 22 and the intermediate insulating layer 23 function as base layers of the channel 7. The lower insulating layer 22 is provided on a first portion 25A of the substrate 21, and the intermediate insulating layer 23 is provided on the first insulating layer 22 and the second magnetic shield S2. That is, in FIG. 9, the intermediate insulating layer 23 is disposed above the first portion 25A and a second portion 25B of the substrate 21. Therefore, the main channel layer 7A is mounted on the intermediate insulating layer 23 disposed above the first portion 25A of the substrate 21. In addition, the third channel layer 7C is mounted on the intermediate insulating layer 23 disposed above the second portion 25B of the substrate 21.

Each of the lower insulating layer 22 and the intermediate insulating layer 23 is composed of an insulating material, for example, an oxide film of alumina or the like. The thickness (length in the Z-axis direction) of the lower insulating layer 22 is, for example, 0.02 µm to 1 µm. The thickness (length in the Z-axis direction) of the intermediate insulating layer 23 is, for example, 0.003 µm to 0.03 µm. In this way, the lower insulating layer 22 and the intermediate insulating layer 23 which function as the base layers of the channel 7 are made relatively thick, so that leakage of the spin current and electric current from the channel 7 can be suppressed.

The magnetic sensor 1 further includes a channel-magnetic shield insulating layer 24. The channel-magnetic shield insulating layer 24 is provided between the channel 7 (the main channel layer 7A and the third channel layer 7C) and the first magnetic shield layer S1. The channel 7 is insulated from the first magnetic shield layer S1 and the second magnetic shield layer S2 by the intermediate insulating layer 23 provided below the third channel layer 7C and the channel-magnetic shield insulating layer 24 provided on the upper and side surfaces of the third channel layer 7C and on one of the side surfaces of the main channel layer 7A in the Y-axis direction. The channel-magnetic shield insulating layer 24 is composed of an insulating material. The lower insulating layer 22, the intermediate insulating layer 23, and the channel-magnetic shield insulating layer 24 are composed of, for example, $HfO_2$, $SiO_2$, $Al_2O_3$, MgO, SiC, or the like.

EXAMPLES

Although examples of a method for manufacturing the spin conduction element according to the embodiment of the present invention are described below, the present invention is not limited to these examples.

Example 1

A spin conduction element having the configuration shown in FIG. 3 was formed as Example 1. First, an alignment mark was formed on the substrate 21 previously prepared. Then, an insulating film used for the lower insulating layer 22 was formed over the entire surface of the substrate 21. In order to form the lower insulating layer 22, silicon oxide was deposited to a thickness of 5 nm.

Then, a semiconductor layer for the channel 7 was formed on the insulating layer by a MBE method. The semiconductor layer was, for example, a Si layer of 50 nm. The semiconductor layer was crystallized by laser annealing, or a Si single crystal was cut out and bonded to the insulating layer serving as the intermediate insulating layer 23. Then, phosphorus was implanted into Si by an ion implantation technique to adjust an impurity concentration. In this case, the impurity concentration was $5 \times 10^{19}/cm^3$, and impurities were activated by a rapid thermal annealing (RTA) method.

After the semiconductor layer was crystallized, the surface of the semiconductor layer was washed by RCA washing and hydrofluoric acid washing. Then, for example, a MgO layer of 1 nm serving as a barrier, a Fe layer of 5 nm serving as a ferromagnetic layer, and a Ti layer of 3 nm serving as a protective layer were formed on the semiconductor layer by a MBE method. Further, a synthetic composite film containing CoFe, Ru, CoFe, IrMn, Ru, and Ta in that order was formed by a sputtering method. This structure allows the Fe layer to be pinned by an antiferromagnetic layer.

Then, annealing in a magnetic field was performed to pin the magnetization directions of ferromagnetic mounted films by the antiferromagnetic layer.

Next, a mask was formed for forming the first electrode 20A, the second electrode 20B, the third electrode 20C, the fourth electrode 20D, and the fifth electrode 20E into, for example, a rectangular shape by an EB method. By using the mask, unnecessary portions of the barrier layer and the ferromagnetic layer on the channel 7 and a portion of the channel 7 were removed by an ion milling method. As a result, the first electrode 20A, the second electrode 20B, the third electrode 20C, the fourth electrode 20D, and the fifth electrode 20E were formed.

Further, a plurality of pads for electrodes were formed on the substrate 21 and used for wiring between the first electrode 20A and the second electrode 20B, between the third electrode 20C and the sixth electrode 20F, and between the fourth electrode 20D and the fifth electrode 20E. The spin conduction element of Example 1 was manufactured as described above.

The first electrode 20A and the second electrode 20B were connected to a current source, and further the fourth electrode 20D and the fifth electrode 20E were connected to another current source. Spins are injected into the channel 7 by passing a current to the channel 7 from each of the current sources. A voltmeter was installed between the third electrode 20C and the sixth electrode 20F to detect as a voltage the spins flowing in the channel 7. The spin state in the channel 7 is changed by applying an external magnetic field B in the Y-direction or Z-direction, and thus a voltage corresponding to the external magnetic field is detected. FIG. 8 shows changes in voltage with the external magnetic field. When a large enough external magnetic field B is applied in the Y-direction, spins injected into the channel 7 are rotated and attenuated. The output with the zero and large enough magnetic fields applied was 7.0 µV.

Example 2

Next, the first ferromagnetic layer 12A, the second ferromagnetic layer 12B, the third ferromagnetic layer 12C, the fourth ferromagnetic layer 12D, and the fifth ferromagnetic layer 12E were formed by the same method as in Example 1, and then only the first ferromagnetic layer 12A and the fifth ferromagnetic layer 12E were exposed by photolithography. Then, Ru, CoFe, IrMn, Ru, and Ta in the first ferromagnetic layer 12A and the fifth ferromagnetic layer 12E were removed by ion milling to expose the CoFe layer. Further, a Ta layer was formed on the CoFe layer. Consequently, the coercive force of the first ferromagnetic layer 12A and the fifth ferromagnetic layer 12E can be made weaker than that of the second ferromagnetic layer 12B, the third ferromagnetic layer 12C, and the fourth ferromagnetic layer 12D.

As a result, a spin conduction element with the configuration shown in FIG. 5 was obtained, in which the coercive force of the second ferromagnetic layer 12B, the third ferromagnetic layer 12C, and the fourth ferromagnetic layer 12D was made different from that of the first ferromagnetic layer 12A and the fifth ferromagnetic layer 12E. Like in Example 1, changes in voltage with the external magnetic field were measured, and the output was 13.4 µV.

Comparative Example 1

In Comparative Example 1, a spin conduction element was manufactured by the same method as in Example 1 except that the fourth electrode 20D and the fifth electrode 20E were not provided as in the configuration shown in FIG. 7. Like in Example 1, changes in voltage with changes in the external magnetic field were measured, and the output was 3.2 µV.

These results are shown in Table 1.

TABLE 1

|  | Example 1 | Example 2 | Comparative Example 1 |
| --- | --- | --- | --- |
| Output (µV) | 7.0 | 13.4 | 3.2 |

A comparison between the outputs obtained in Example 1 and Comparative Example 1 reveals that the output obtained in Example 1 is about 2 times as high as Comparative Example 1. Further, a comparison between the outputs obtained in Example 1 and Example 2 reveals that the output obtained in Example 2 is about 2 times as high as Example 1. Therefore, it is found that in the structure of Example 1, when the first electrode 20A and the fifth electrode 20E are made of ferromagnetic layers, and the coercive force of the ferromagnetic layers of the second electrode 20B, the third electrode 20C, and the fourth electrode 20D is larger than that of the first electrode 20A and the fifth electrode 20E, higher output can be obtained.

(Example of Magnetic Sensor)

The structures of Examples 1 and 2 are allowed to function as a magnetic sensor. An example of the magnetic sensor is described below.

In an example of the magnetic sensor, steps described below are added to Examples 1 and 2.

An insulating layer was formed to, for example, 20 nm on the surface in which the channel 7 is exposed, and the side surfaces of the insulating film 81 and the ferromagnetic layer 12. Then, a resist mask is formed to cover above the first portion 25A of the substrate 21 by photolithography, and the first magnetic shield layer S1 is formed above the second portion 25B of the substrate 21. This causes the third channel layer 7C to be covered with the first magnetic shied layer S1 through the insulating layer (the channel-magnetic shield insulating layer 24). In addition, the first magnetic shield layer S1 is formed on the second magnetic shield layer S2 through the intermediate insulating layer 23. As a result, the both sides of the third channel layer 7C in the thickness direction (Z-axis direction) and both sides of the third channel layer 7C in the first direction (X-axis direction) are covered with the magnetic shield S through the insulating layer, and the end surface of the third channel layer 7C in the projecting direction is exposed.

The operation and effect of the magnetic sensor 1 according to the embodiment of the present invention are described below. Before the magnetic sensor 1 is operated, the magnetization directions of the ferromagnetic layers are pinned. In the examples shown in FIGS. 4, 5, 6, and 9, the magnetization direction G1 of the first ferromagnetic layer 12A is pinned in the same as the magnetization direction G5 of the fifth ferromagnetic layer 12E, i.e., pinned in the first direction (X-axis direction). At the same time, the magnetization directions G2, G3, and G4 of the second, third, and fourth ferromagnetic layers 12B, 12C, and 12D are pinned in the first direction (X-axis direction) by the antiferromagnetic layer. The magnetization directions G1 and G5 of the first ferromagnetic layer 12A and the fifth ferromagnetic layer 12E are opposite to the magnetization directions G2, G3, and G4 of the second, third, and fourth ferromagnetic layers 12B, 12C, and 12D.

In the magnetic sensor 1, the channel 7 includes the main channel layer 7A and the third channel layer 7C, and the magnetic shield S covers the periphery of the third channel layer 7C in the projecting direction so as to expose the end surface of the main channel layer 7A. Therefore, the external magnetic field B can be selectively supplied to the channel 7 from the exposed end surface.

As shown in FIG. 9, for example, a current is passed through the first ferromagnetic layer 12A and the second ferromagnetic layer 12B by connecting the first electrode 20A and the second electrode 20B to a current source 70. When a current is passed through the nonmagnetic main channel layer 7A from the first and second ferromagnetic layers 12A and 12B composed of a ferromagnetic material through the insulating film 81, electrons having spins in the same direction are injected into the channel 7 from the first and second ferromagnetic layers 12A and 12B. The injected spins diffuse toward the third ferromagnetic layer 12C. As a result, a structure can be formed, in which the current and spins flowing in the channel 7 mainly flow in the first direction (X-axis direction). Similarly, for example, a current is passed through the fourth ferromagnetic layer 12D and the fifth ferromagnetic layer 12E by connecting the fourth electrode 20D and the fifth electrode 20E to a current source 71. When a current is passed through the nonmagnetic main channel layer 7A from the fourth and fifth ferromagnetic layers 12D and 12E composed of a ferromagnetic material through the insulating film 81, electrons having spins in the same direction are injected into the channel 7 from the fourth and fifth ferromagnetic layers 12D and 12E. The injected spins diffuse toward the third ferromagnetic layer 12C. As a result, a structure can be formed, in which the current and spins flowing in the channel 7 mainly flow in the first direction (X-axis direction).

In this state, when the external magnetic field B is not applied to the channel 7, i.e., when the external magnetic field B is zero, in an example shown in FIG. 6, the directions of spins diffusing in the third region 73 of the channel 7 are not rotated. Therefore, the spins in the same direction as the predetermined magnetization direction G3 of the third ferromagnetic layer 12C diffuse to the third region 73. Thus, when the external magnetic field B is zero, resistance output or current output becomes an extreme value. A maximum or minimum value can be obtained depending on the direction of the current or magnetization. The output can be measured by, for example, an output measuring device such as a voltage measuring device 80 connected to the third ferromagnetic layer 12C and the sixth electrode 20F.

On the other hand, consideration is given to a case in which the external magnetic field B is applied to the channel 7. The external magnetic field B is applied to the channel 7 from the third channel layer 7C through the exposed end surface thereof exposed in the through hole H. In the example shown in FIG. 9, the external magnetic field B is applied from a direction (−Y-axis direction) perpendicular to the magnetization direction G2 (X-axis direction) of the second ferromagnetic layer 12B and the magnetization direction G4 (X-axis direction) of the fourth ferromagnetic layer 12D. When the external magnetic field B is applied, the directions of spins diffusing in a region corresponding to the through hole H in the channel 7 are rotated around the axial direction (−Y-axis direction) of the external magnetic field B (so-called Hanle effect). The voltage output or resistance output at an interface between the channel 7 and the third ferromagnetic layer 12C is determined by a relative angle between the rotation direction when the spins diffuse to the third region 73 of the channel 7 and the predetermined magnetization direction G3 of the third ferromagnetic layer 12C, i.e., the spins. When the external magnetic field B is applied, the direction of spins diffusing in the channel 7 is rotated, and thus the spin direction does not necessarily coincide with the magnetization direction G3 of the third ferromagnetic layer 12C. Therefore, when the resistance output or voltage output becomes the maximum value at the external magnetic field B of zero, the output is the maximum value or less when the external magnetic field B is applied, while when the output becomes the minimum value at the external magnetic field B of zero, the output is the minimum value or more when the external magnetic field B is applied.

Therefore, in the magnetic sensor 1, an output peak appears at the magnetic field B of zero, and the output decreases as the external magnetic field B is increased or decreased. That is, the output changes depending on whether or not the external magnetic field B is applied, and thus the magnetic sensor 1 according to the embodiment can be used as a magnetic detecting element. In a conventional magnetic sensor using spins, an output peak appears according to a relative angle between the parallel or antiparallel magnetization directions of a free magnetization layer and a pinned magnetization layer. However, in the magnetic sensor 1 according to the embodiment of the present invention, as described above, an output peak appears at the external magnetic field of zero. Therefore, for example, when timing of positive and negative external magnetic fields is read by applying the magnetic sensor 1 according to the embodiment to a magnetic head, an output peak appears when the magnetic fields of a magnetic domain wall are cancelled to zero, which can be determined as "reversal". In addition, no hysteresis occurs in the magnetic sensor 1.

Therefore, a minute magnetic flux corresponding to the size of the end surface of the third channel layer 7C can be detected by using the end surface exposed from the magnetic shield S. In this case, since detection resolution of the external magnetic field is determined by the size of the end surface, a magnetic flux can be detected from a minute region without making finer the size (for example, the area on the XY plane) of the ferromagnetic layers. Thus, an increase in element resistance caused by making the ferromagnetic layers finer can also be suppressed.

As described above, the magnetic shield S surrounds the periphery of the third channel layer 7C in the projecting direction (Y-axis direction) so as to expose the end surface of the third channel layer 7C. This structure can be easily formed, with high mass productivity, by previously forming a portion (second magnetic shield layer S2) of the magnetic shield S on the substrate 21, forming the channel including the main channel layer 7A and the third channel layer 7C on the magnetic shield S, and then further forming the other portion (first magnetic shield layer S1) of the magnetic shield S on the side and upper surfaces of the third channel layer 7C. In addition, for example, when the magnetic sensor 1 is applied to a magnetic head, the magnetic sensor 1 can be mounted perpendicularly to an ABS surface and thus preferably has high compatibility with a method for manufacturing a recording head unit formed by mounting layers perpendicularly to the ABS surface.

Although the preferred embodiments of the present invention are described in detail above, the present invention is not limited to the embodiments described above. The shape of the end surface of the third channel layer 7C in the projecting direction is not limited to the above-described rectangular shape, and may be, for example, a triangular shape, a trapezoidal shape, or a circular shape. With any one of the shapes, the external magnetic field B can be preferably detected.

Although the above-described embodiments describe a case where the magnetization directions of the first, second, third, fourth, and fifth ferromagnetic layers 12A, 12B, 12C, 12D, and 12E coincide with the X-axis direction, the magnetization directions of the first, second, third, fourth, and fifth ferromagnetic layers 12A, 12B, 12C, 12D, and 12E may be any direction as long as they are perpendicular to the projecting direction (Y-axis direction) of the third channel layer 7C. As described above, when the external magnetic field B is applied to the channel 7, the direction of spins in the channel 7 is rotated around the axis (Y-axis) of the magnetic field B applied. If the magnetization directions of the ferromagnetic layers are parallel to the projecting direction of the third channel layer 7C, even when spins are injected from any one of the ferromagnetic layers, the direction of the spins is not rotated by applying the external magnetic field B, thereby causing difficulty in detecting a magnetic flux. Therefore, when the magnetization directions of the first, second, third, fourth, and fifth ferromagnetic layers 12A, 12B, 12C, 12D, and 12E is perpendicular to the projecting direction of the third channel layer 7C, the magnetic flux can be preferably detected.

For example, the magnetization directions of the first, second, third, fourth, and fifth ferromagnetic layers 12A, 12B, 12C, 12D, and 12E may be the same as the mounting direction (Z-axis direction) of the first, second, third, fourth, and fifth ferromagnetic layers 12A, 12B, 12C, 12D, and 12E with respect to the main channel layer 7A. Also in this case, the magnetization direction of spins injected from the ferromagnetic layers and conducted in the channel 7 is rotated by the magnetic field B applied from the end surface of the third channel layer 7C. Therefore, the magnetic flex can be preferably detected.

When the magnetization directions of the first, second, third, fourth, and fifth ferromagnetic layers 12A, 12B, 12C, 12D, and 12E is the same as the mounting direction thereof with respect to the main channel layer 7A, a difference in coercive force is preferably imparted by forming the ferromagnetic layers having different thicknesses.

In addition, the surfaces of the main channel layer 7A and the third channel layer 7C are preferably covered with an insulating layer. The end surface of the third channel layer 7C is exposed without being covered with the magnetic shield S. In order to suppress contact of the end surface with a magnetic recording medium 20, an insulating film for protection may be formed on the end surface of the third channel layer 7C or a lubricant may be applied to the end surface.

The main channel layer 7A, the second channel layer 7B, and the third channel layer 7C are preferably electrically insulated from the magnetic shield S. In this case, a current and spins can be suppressed from flowing out to the magnetic shield S from the main channel layer 7A, the second channel layer 7B, and the third channel layer 7C.

The ferromagnetic layer material of each of the first, second, third, fourth, and fifth ferromagnetic layers 12A, 12B, 12C, 12D, and 12E is preferably a metal selected from the group consisting of Cr, Mn, Co, Fe, and Ni, an alloy containing at least one element of the group, or a compound containing at least one element selected from the group and at least one element selected from the group consisting of B, C, N, Si, and Ge. These materials are ferromagnetic materials having high spin polarizability, and thus the function as a spin injection electrode or a spin reception electrode can be preferably realized.

The material of the channel 7 (the main channel layer 7A, the second channel layer 7B, and the third channel layer 7C) is preferably a semiconductor containing any one of Si, Ge, GaAs, C, and ZnO. Since the semiconductor has a relatively long spin diffusion length, spins can be preferably accumulated in the channel 7. In addition, since a half-width of a peak of voltage output or resistance output with respect to the external magnetic field is proportional to the reciprocal of the spin lifetime in the channel 7, the magnetic field sensitivity is improved with increases in the spin lifetime. Examples of a material with a long spin lifetime used for the channel 7 include Si, GaAs, and the like. Among these, Si is particularly preferred. With the shorter spin lifetime in the channel 7, the magnetic field sensitivity is worsened, but a wide range of magnetic fields can be detected.

Although, in the example described above, the tunnel barrier including an insulating film is applied as a barrier provided between the channel 7 and the ferromagnetic layer, the barrier may be a Schottky barrier. The Schottky barrier can be formed by, for example, Schottky junction between the ferromagnetic layer composed of a metal and the channel 7 composed of a semiconductor.

Figure 10:
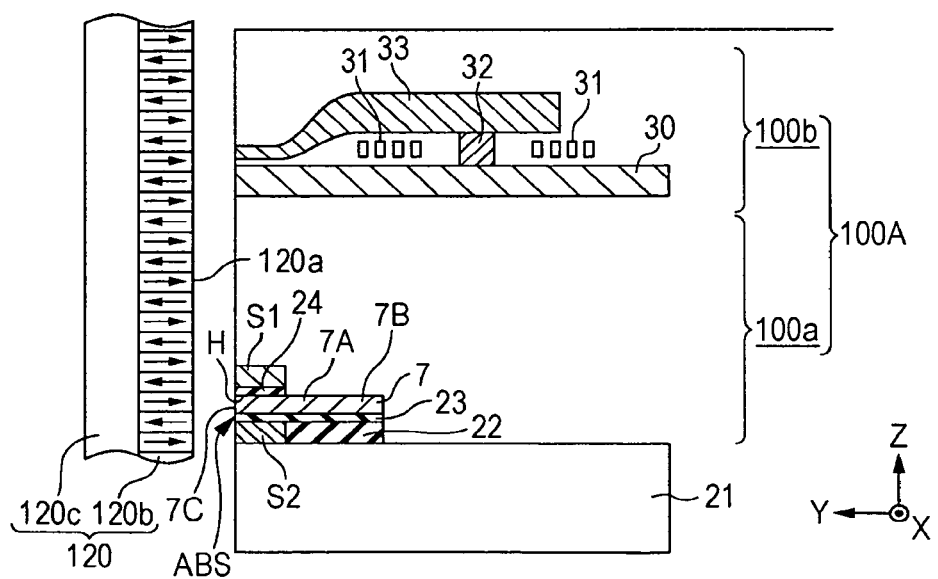
FIG. 10 is a schematic drawing showing a thin-film magnetic recording and reproducing head (magnetic head).

FIG. 10 is a schematic diagram showing a thin-film magnetic recording and reproducing head (magnetic head) 100A. The magnetic sensor 1 described above can be applied to a reading head unit 100a of the thin-film magnetic recording and reproducing head 100A. Specifically, the thin-film magnetic recording and reproducing head 100A performs an operation of recording and reading magnetic information at a position where the air bearing surface (ABS: medium-facing surface) thereof is disposed to face a recording surface 120a of the magnetic recording medium 120. The thin-film magnetic recording and reproducing head 100A is disposed so that the end surface of the third channel layer 7C exposed from the through hole H in the magnetic sensor 1 corresponds to the air bearing surface ABS.

The magnetic recording medium 120 includes a recording layer 120b having the recording surface 120a and a soft magnetic backing layer 120c mounted on the recording layer 120b, and is moved relatively to the thin-film magnetic recording and reproducing head 100A in a direction shown by the Z-axis direction in FIG. 10. Besides the reading head unit 100a which reads record from the magnetic recording medium 120, the thin-film magnetic recording and reproducing head 100A includes a recording head unit 100b which performs recording on the magnetic recording medium 120. The reading head unit 100a and the recording head unit 100b are provided on the substrate 21 and are covered with a nonmagnetic insulating layer of alumina or the like.

As shown in FIG. 10, the recording head unit 100b for writing is provided on the reading head unit 100a. In the recording head unit 100b, a contact portion 32 and a main pole 33 are provided on a return yoke 30 to form a magnetic flux path. A thin-film coil 31 is provided to surround the contact portion 32 so that when a recording current is passed through the thin-film coil 31, a magnetic flux is emitted from the tip of the main pole 33 to permit information recording on the recording layer 120 of the magnetic recording medium 120 such as a hard disk or the like. As described above, the thin-film magnetic recording and reducing head 100A and a magnetic recording and reproducing device which are capable of detecting a magnetic flux from a minute region of a recording medium can be provided by using magnetic sensor 1 of the present invention.

What is claimed is:
1. A spin conduction element comprising:
   a first region, a second region, a third region, a fourth region, and a fifth region provided on a main channel layer extending in a first direction, the regions being arranged in that order in the first direction;

a first electrode mounted on the first region;
a second electrode mounted on the second region;
a third electrode mounted on the third region;
a fourth electrode mounted on the fourth region; and
a fifth electrode mounted on the fifth region,
wherein the second electrode,
the third electrode and
the fourth electrode each include a ferromagnetic layer composed of a ferromagnetic material; and
the magnetization directions of the ferromagnetic layers of the second, third and fourth electrodes are the same.

2. The spin conduction element according to claim 1, further comprising:
a second channel layer provided in the third region of the channel layer to extend in a second direction different from the first direction on the same plane as the first direction;
a sixth region extending in the second direction; and
a sixth electrode mounted on the sixth region.

3. The spin conduction element according to claim 1,
wherein the first electrode and the fifth electrode each include a ferromagnetic layer composed of a ferromagnetic material;
the magnetization directions of the ferromagnetic layers of the first and fifth electrodes are the same; and
the magnetization directions of the ferromagnetic layers of the first and fifth electrodes are opposite to the magnetization directions of the ferromagnetic layers of the second, third and fourth electrodes.

4. The spin conduction element according to claim 2,
wherein a current is applied to the first electrode from the second electrode;
a current is applied to the fifth electrode from the fourth electrode; and
a voltage between the sixth electrode and the third electrode is measured.

5. The spin conduction element according to claim 2, further comprising:
a third channel layer projecting from the side surface of the third region of the main channel layer in a direction perpendicular to the thickness direction of the main channel layer and opposite to the second direction of the sixth region; and
a magnetic shield provided to cover both sides of the third channel layer in the thickness direction and both sides of the third channel layer in the first direction and to expose the end surface of the third channel layer in the projecting direction.

6. The spin conduction element according to claim 5, wherein the magnetization directions of the ferromagnetic layers of the second, third and fourth electrodes are perpendicular to the direction in which the third channel layer projects.

7. The spin conduction element according to claim 1, wherein the magnetization directions of the ferromagnetic layers of the second, third and fourth electrodes are pinned by respective antiferromagnetic layers disposed on the ferromagnetic layers of the second, third and fourth electrodes.

8. The spin conduction element according to claim 1, wherein a barrier is formed between the main channel layer and at least one of the ferromagnetic layers of the second, third and fourth electrodes.

9. The spin conduction element according to claim 8, wherein the barrier is a tunnel barrier composed of an insulating film.

10. The spin conduction element according to claim 9, wherein the barrier is a Schottky barrier.

11. A magnetic sensor comprising the spin conduction element according to claim 1.

12. A magnetic head comprising:
a reading head unit including the magnetic sensor according to claim 11; and
a recording head unit for writing.

13. A magnetic recording and reproducing device comprising a magnetic recording medium and the magnetic head according to claim 12.

* * * * *